US012770077B2

(12) United States Patent
Haring et al.

(10) Patent No.: US 12,770,077 B2
(45) Date of Patent: Oct. 20, 2026

(54) METHOD FOR CONSTRUCTING A GOODS LOGISTICS FACILITY, COMPUTER-READABLE STORAGE MEDIUM, AND GOODS LOGISTICS FACILITY

(71) Applicant: Jungheinrich AG, Hamburg (DE)

(72) Inventors: Stefan Haring, Stainz (AT); Juergen Luttenberger, Wagna (AT)

(73) Assignee: Jungheinrich AG, Hamburg (DE)

( * ) Notice: Subject to any disclaimer, the term of this patent is extended or adjusted under 35 U.S.C. 154(b) by 192 days.

(21) Appl. No.: 18/413,731

(22) Filed: Jan. 16, 2024

(65) Prior Publication Data

US 2024/0249221 A1 Jul. 25, 2024

(30) Foreign Application Priority Data

Jan. 20, 2023 (EP) .................................... 23152707

(51) Int. Cl.

*G06Q 10/0631* (2023.01)
*G06F 30/13* (2020.01)
*G06Q 10/067* (2023.01)
*G06Q 10/08* (2024.01)

(52) U.S. Cl.

CPC ....... *G06Q 10/06313* (2013.01); *G06F 30/13* (2020.01); *G06Q 10/067* (2013.01); *G06Q 10/08* (2013.01)

(58) Field of Classification Search

CPC ........... G06Q 10/06313; G06Q 10/067; G06Q 10/08; G06Q 10/0631; G06F 30/13; G06F 30/12

See application file for complete search history.

(56) References Cited

U.S. PATENT DOCUMENTS

2014/0046635 A1* 2/2014 Kersh ...................... G06F 30/20 703/1
2020/0073399 A1* 3/2020 Tateno ................. G05D 1/0251
2022/0229415 A1 7/2022 Kobel et al.

OTHER PUBLICATIONS

Kritzinger et al., "Digital Twin in manufacturing: A categorical literature review and classification", IFAC-PapersOnLine, 51-11 (2018) 1016-1022.

(Continued)

*Primary Examiner* — Charles Guiliano

(74) *Attorney, Agent, or Firm* — Scully, Scott, Murphy & Presser, P.C.

(57) ABSTRACT

A method for constructing a goods logistics facility and to a corresponding goods logistics facility. The method can include: creating a logistics facility project file associated with the goods logistics facility, inserting and storing data describing properties of at least one of the following components of the goods logistics facility, in the logistics facility project file, and realizing the goods logistics facility using the data stored in the logistics facility project file, wherein at least one measure influencing the goods logistics facility with regard to its design, geometric and/or functional properties or monitoring with regard to a state of the goods logistics facility is carried out during the life cycle of the goods logistics facility using the data stored in the logistics facility project file.

15 Claims, 9 Drawing Sheets

(56) References Cited

OTHER PUBLICATIONS

Guo et al., “Modular based flexible digital twin for factory design”, Journal of Ambient Intelligence and Humanized Computing, 10, 1189-1200 (2018).
Kuhl et al., “Warehouse Digital Twin: Simulation Modeling and Analysis Techniques”, Proceedings of the 2022 Winter Simulation Conference, IEEE, 2947-2956 (2022).

* cited by examiner

METHOD FOR CONSTRUCTING A GOODS LOGISTICS FACILITY, COMPUTER-READABLE STORAGE MEDIUM, AND GOODS LOGISTICS FACILITY

CROSS-REFERENCE TO RELATED APPLICATION

The present application is based upon and claims priority to European Patent Application No. 23 152 707.8, filed on Jan. 20, 2023. The entire disclosure of European Patent Application No. 23 152 707.8 is incorporated herein by reference.

BACKGROUND

The present disclosure relates to a method for constructing a goods logistics facility, to a non-transitory computer-readable storage medium, and to a goods logistics facility.nit Goods logistics facilities, such as a warehouse or transshipment terminal, comprise a building in which, for example, a store or a goods sorting station are present. Furthermore, logistics infrastructure elements, for example rolling gates, signal lights or charging stations for electrically operated industrial trucks, are integrated into the building. In the goods logistics facility, intralogistics goods transport devices are also operated, which, in addition to the industrial trucks already mentioned by way of example, can also be constituted by conveyor lines such as belt conveyors. In order for the logistics infrastructure elements and the intralogistics goods transport devices to interact in the desired manner, driving areas and transport paths which are navigated by the industrial trucks are defined in a goods logistics facility. The logistics infrastructure elements and intralogistics goods transport devices, including the building of the goods logistics facility, present in the goods logistics facility are to be referred to as components of the goods logistics facility.

A multitude of aspects may be taken into account in the planning and implementation of a goods logistics facility. In many cases, planning is therefore carried out using planning software.

SUMMARY

An object is to specify a method for constructing a goods logistics facility, a computer-readable storage medium, and a goods logistics facility, wherein data which describe a component of the goods logistics facility is to be made more usable.

The object can be achieved by a method for constructing a goods logistics facility, which comprises the following steps:

creating a logistics facility project file associated with the goods logistics facility, inserting and saving data describing the properties of at least one of the following components of the goods logistics facility in the logistics facility project file:

design properties of a building of the goods logistics facility, geometric and/or functional properties of driving areas and/or transport paths in the logistics facility, geometric and/or functional properties of logistics infrastructure elements of the goods logistics facility, geometric and/or functional properties of intralogistics goods transport devices, such as industrial trucks, used in the goods logistics facility, creating a planning model of the goods logistics facility using the data stored in the logistics facility project file, realizing the goods logistics facility on the basis of the planning model and using the data stored in the logistics facility project file, wherein at least one measure influencing the goods logistics facility with regard to its design, geometric and/or functional properties or monitoring with regard to a state of the goods logistics facility is carried out during the life cycle of the goods logistics facility using the data stored in the logistics facility project file.

The method is a computer-implemented method.

Design properties of the building of the goods logistics facility can be, for example, the dimensions or measurements of the building or structure, generally also referred to as geometric data of the building. The geometric data can be true-to-scale data. Further design properties can be, for example, the load-bearing capacity or resilience of individual structures or components of the building. Design properties of the building can be, for example those properties that always relate to the building itself and not to its use.

Geometric properties of driving areas or transport paths are, for example, the course, the position, dimensions, and/or measurements of the transport paths. These geometric data can also be true-to-scale data and, for example, can define a position, dimensions or a course of the driving areas and transport paths within the logistics facility.

Functional properties of driving areas are, for example, a permitted maximum speed, a maximum possible clearance height, a maximum number of industrial trucks permitted in a driving area, for example, or the vehicle type or the vehicle types permitted in a specific driving area. Specific lanes can be defined in a driving area. A lane can be assigned a predefined direction in which it is to be traveled.

Logistics infrastructure elements are, for example, shelves, loading aid stations, i.e., areas in which loading aids such as pallets are picked up and set down, charging stations for charging electrically operated industrial trucks, floor parking spaces, transfer locations or areas, such as ramps, parking positions, and gates, traffic lights, rolling gates, fire protection doors, transit areas, buttons for manually triggering transport journeys, and the like. Logistics infrastructure elements are to be understood as those elements that are fixedly connected to the building of the goods logistics facility and interact with the flow of goods taking place within the goods logistics facility. Logistics infrastructure elements are arranged or mounted in a stationary manner in the goods logistics facility.

Geometric properties of logistics infrastructure elements are, for example, their dimensions and position within the goods logistics facility, a maximum clearance width and/or height, for example of a gate, a passage or a passageway.

Functional properties of logistics infrastructure elements are, for example, the ability of a rolling gate to automatically open or be provided for manual operation. A further functional property can be the period of time required for opening or closing the rolling gate. This parameter can be taken into account in the system, so that the rolling gate opens in good time such that it is possible, for example, for an industrial truck to pass through the rolling gate without having to slow down. A further functional property of a logistics infrastructure element can be, for example, the maximum charging current that can be provided at a charging station.

Intralogistics goods transport devices can be industrial trucks. However, storage and retrieval devices, block storage systems, conveyor lines, belt conveyors and the like can also be regarded as intralogistics goods transport devices. Intralogistics goods transport devices are provided and configured for the transport of goods within the goods logistics facility; they drive the flow of goods taking place within the goods logistics facility.

Geometric properties of intralogistics goods transport devices are, for example, the measurements or dimensions of an industrial truck or also the dimensions and the position of a conveyor line or a belt conveyor, for example.

Functional properties of the intralogistics goods transport devices are, for example, a maximum speed of an industrial truck, a minimum or maximum turning radius of the industrial truck, a maximum turning speed, a maximum lift height, or a permissible working load of the industrial truck. Functional properties of intralogistics goods transport devices which are not industrial trucks, i.e., for example, of a belt conveyor, are, for example, a conveying capacity, a conveying direction or conveying speed.

Apart from the planning and implementation of the goods logistics facility, the logistics facility project file can also be used for at least one further measure during the life cycle of the goods logistics facility. In this way, the data stored in the logistics facility project file, which were often generated and entered into the file with great effort, can be used during this further development phase. This signifies enormous progress in respect of efficiency, since a duplication of the data collection is eliminated. During implementation of the further measure, which is carried out during the service life of the logistics facility, therefore, in other words, data that have already been collected during the planning and realization of the goods logistics facility need not be collected again. In addition to the significantly reduced effort for collecting the data, the standardization of the data basis by storing the data in the logistics facility project file can also result in considerable progress in the efficiency of the further measure. A consistency created by the uniform data basis between planning, realization on the one hand and the further measure on the other hand can reduce possible errors during the planning and implementation of the measure and also during the planning and implementation of the overall project.

According to one embodiment, the logistics facility project file is used for all measures carried out during the life cycle of the goods logistics facility. This file thus serves as a central storage location for all relevant data used in conjunction with the goods logistics facility.

In the context of the present disclosure, the term "logistics facility project file" does not necessarily mean a single file in the sense of a single document. Rather, it can be a collection of a plurality of files which are combined in a central storage location, namely the logistics facility project file.

According to an embodiment, the method comprises:

simulating an operation of the goods logistics facility in the planning model of the goods logistics facility, optimizing the planning model of the goods logistics facility based on a result of the simulation, updating the data present in the logistics facility project file on the basis of the results of the optimization, creating a finalized planning model of the goods logistics facility, and storing the model data of the finalized planning model in the logistics facility project file, wherein the logistics facility project file comprises: geometric data describing transport paths to be navigated in the goods logistics facility, and geometric data relating to a plurality of logistics infrastructure elements interacting with the intralogistics goods transport devices, such as goods transfer stations, charging stations, parking positions, parking spaces, and/or storage locations, wherein simulating the operation of the goods logistics facility comprises a validation of the transport paths to be navigated, wherein, during the validation of the transport paths to be navigated, it is checked whether a further complete, continuously navigable lane graph can be created, which connects at least some of the logistics infrastructure elements, and further all logistics infrastructure elements, to one another.

The simulation of the operation of the goods logistics facility can be carried out before the realization of the goods logistics facility. It can be carried out on the basis of the planning model.

In other words, according to such an embodiment, the goods logistics facility is realized on the basis of the finalized planning model. When generating a lane graph, it is also possible to check whether the prescribed or provided distances to the non-driving areas are maintained for the provided industrial trucks, given the dimensions of the driving areas, for example. This relates, for example, to the prescribed distances from building structures such as the walls of the building. Furthermore, it can be checked, for example, whether the specified lane graph can actually be navigated by the planned type of industrial truck.

By simulating the operation of the goods logistics facility, its functionality and performance can be viewed and analyzed in detail. The planning model can be optimized with regard to the functionality and performance of the goods logistics facility so that possible limitations of the goods logistics facility could already be eliminated before its realization. All steps from planning to simulation and optimization to the realization of the goods logistics facility can be carried out on the basis of the data stored in the logistics facility project file.

According to a further embodiment, the method comprises: creating a material list and/or a list of required construction services for realizing the goods logistics facility using the data stored in the logistics facility project file, and creating a cost estimation for realizing the goods logistics facility using the material list and/or the list of required construction services.

The material list names the components, parts and materials that can realize the goods logistics facility and describes them with regard to their properties. Construction services listed in the list of required construction services are, those required for processing the goods named in the material list when creating the goods logistics facility. For example, these are craftsman services or services provided by construction machinery. The possibility to create a cost estimate on the basis of the logistics facility project file is provided. If changes in the planning of the goods logistics facility are made or if this is optimized as mentioned above with regard to one or more of its properties, a corresponding cost estimate can be output at any time. This represents a good basis for decision-making.

According to a further embodiment, the following steps are carried out as a measure: starting an operation of the goods logistics facility, wherein the start of the operation comprises configuring and/or teaching the logistics infrastructure elements and/or the intralogistics goods transport devices, and configuring and/or teaching is carried out using the data present in the logistics facility project file.

In other words, the logistics facility project file or data derived therefrom is transferred to a central control unit (e.g., one or more controllers comprising hardware) of the goods logistics facility, thus enabling it to control the goods logistics facility. In the same way, the logistics facility project file or data derived therefrom is used to configure logistics infrastructure elements in by configuring them via the central control unit using the logistics project file, and/or the logistics project file or data derived therefrom are transferred to the logistics infrastructure elements for this purpose.

The goods logistics facility can be put into operation without the need for further data from the goods logistics facility to be detected. The seamless use of the data stored in the logistics facility project file can allow rapid and efficient start-up of the goods logistics facility.

Furthermore, the method according to a further embodiment comprises: controlling a running operation of the goods logistics facility, such as an operation of the logistics infrastructure elements and/or of the intralogistics goods transport devices, by a control computer, wherein the control computer carries out a control the goods logistics facility using the data present in the logistics facility project file. In the same way, the logistics facility project file or data derived therefrom is used to operate logistics infrastructure elements in that they are controlled by the central control unit using the logistics facility project file, and/or the logistics facility project file or data derived therefrom are transferred to the logistics infrastructure elements for this purpose.

The running operating control can thus also be carried out seamlessly and on the basis of data stored in the logistics facility project file or data derived therefrom.

According to a further embodiment, the method comprises:

visualizing the goods logistics facility during operation using the data present in the logistics facility project file or data derived therefrom, wherein the logistics facility project file comprises:

dimensions of the building as design properties of the building, dimensions and/or positions of logistics infrastructure elements as geometric properties of the logistics infrastructure elements, and dimensions of intralogistics goods transport devices as geometric properties of the intralogistics goods transport devices, wherein the visualization comprises a graphical representation of the building of the goods logistics facility, and wherein a geometry of this representation is made taking into account the dimensions of the building, such as in at least approximately true-to-scale representation, or in exactly true-to-scale representation, the visualization comprises a graphical representation of the logistics infrastructure elements taking into account the dimensions, such as in at least approximately true-to-scale representation, and/or the positions of the logistics infrastructure elements, and the visualization comprises a graphical representation of the intralogistics goods transport devices taking into account the dimensions, such as in at least approximately true-to-scale representation, of the intralogistics goods transport devices, and wherein further the logistics facility project file comprises:

functional properties of the logistics infrastructure elements and/or intralogistics goods transport devices present in the goods logistics facility, wherein the visualization comprises a representation of a current functional state of the logistics infrastructure elements and/or of the intralogistics goods transport devices, and wherein the visualization comprises a representation of a current position and/or of congestion of the intralogistics goods transport devices.

A visualization of the goods logistics facility during operation can be used for many purposes. For example, an operations manager of the goods logistics facility can use such a visualization to get a quick overview of the state of the goods logistics facility. Furthermore, the visualization often provides a useful basis for optimizing the goods logistics facility or for elimination of technical problems. By using the data stored in the logistics facility project file or data derived therefrom for the visualization of the current operating state of the goods logistics facility, a complex modeling of the goods logistics facility for this purpose can be eliminated.

Visualization can be carried out on the basis of the real dimensions and measurements of both the building of the goods logistics facility and the logistics infrastructure elements and intralogistics goods transport devices. Thus, and insofar as the visualization allows, the building and the logistics infrastructure elements are shown true to scale, for example. However, in view of clarity and presentability of the overall representation, deviations from an exactly true-to-scale representation are permissible. This concerns, for example, the true-to-scale representation of the intralogistics goods transport devices. For example, in the case of a very large building, the intralogistics goods transport devices often cannot be shown exactly to true to scale, since they would otherwise be extremely small. Here, deviations from an exactly true-to-scale representation are intentional and permissible. However, within a class of elements, a representation can in turn be made true-to-scale or that the representation can be oriented on the real dimensions of the corresponding elements. For example, logistics infrastructure elements can be depicted to scale in relation to one another or at least in an approximation of their real size ratios. In other words, for example, a first rolling gate which has twice the passage width of a second rolling gate will also appear to be twice as wide in the visualization. The same can apply to intralogistics goods transport devices. For example, a first industrial truck which is larger compared to a second industrial truck is also shown larger in the visualization.

Visualization takes place at a vehicle control center, for example. According to an alternative embodiment, the visualization takes place on an external computer which is located outside the building of the goods logistics facility.

Specifically, according to another embodiment, the method is further developed in that the measure of visualizing the goods logistics facility further comprises:

visualizing the goods logistics facility at a vehicle control center coupled to the control computer, wherein the logistics facility project file and/or data derived or extracted therefrom are either stored in the vehicle control center or transferred via a data connection between the vehicle control center and the control computer to the vehicle control center, wherein the control computer grants an external computer access to the logistics facility project file and/or the data stored in the logistics facility project file and/or data derived or extracted from the logistics facility project file, and the external computer visualizes the goods logistics facility, wherein the external computer visualizes a current position of the intralogistics goods transport devices and/or an operating state of the logistics infrastructure elements in order to enable a diagnosis of malfunctions of the goods logistics facility. In this context, the external computer receives the data required for representation of the operating state of the logistics infrastructure elements from the control computer of the goods logistics facility.

Remote access to the visualization of the goods logistics facility can be a very useful tool, as in this way, for example, an external service provider can be involved in monitoring, optimizing and, if necessary, maintaining the goods logistics facility. As this external service provider has access to the same information as the operator of the goods logistics facility, this can improve and simplify cooperation considerably.

According to another embodiment, the method further comprises: performing remote maintenance of the goods logistics facility during operation, wherein for example an external computer used during remote maintenance is granted access by the control computer to the logistics facility project file and/or the data stored in the logistics facility project file and/or data derived or extracted from the logistics facility project file, which are stored on the control computer.

Similar advantages as have already been mentioned with regard to the visualization of the goods logistics facility on an external computer apply to performing remote maintenance. Cooperation with an external partner can be considerably simplified.

As the requirements for goods logistics facilities are constantly fluctuating, it is often the case that subsequent extensions or modifications to the goods logistics facility have to be made. According to an embodiment, the method further comprises extending and/or modifying the goods logistics facility while adapting the data present in the logistics facility project file, wherein the extension and/or the modification comprises at least one of the following measures:

adapting geometric data describing the building of the goods logistics facility, such as dimensions of the building, adapting geometric and/or functional properties of the logistics infrastructure elements, exchanging and/or supplementing intralogistics goods transport devices or changing a type of intralogistics goods transport devices, exchanging and/or supplementing the logistics infrastructure elements, changing geometric data describing permitted driving areas and/or transport paths in the goods logistics facility, changing geometric data and/or functional data of the logistics infrastructure elements, changing geometric data and/or functional data of the intralogistics goods transport devices used in the goods logistics facility.

The extension of the goods logistics facility can also be carried out on the basis of the data present in the logistics facility project file since goods logistics facilities can be subject to frequently changing requirements profiles. Therefore, modifications and extensions are required in many cases after completion of the goods logistics facility. This step can be associated with considerable effort, as in many cases a large amount of data has to be newly detected. Since, according to the mentioned embodiment, the data present in the logistics facility project file can be used, a modification and or extension of the goods logistics facility can be carried out with little effort.

The object can also achieved by a non-transitory computer-readable storage medium on which a logistics facility project file is stored for use in a method according to one or more of the of the previously mentioned embodiments. The same or similar advantages as already mentioned with regard to the method itself apply to the non-transitory computer-readable storage medium.

Furthermore, the object can be achieved by a goods logistics facility, realized on the basis of a planning model and using data stored in a logistics facility project file, wherein the logistics facility project file comprises data describing properties of at least one of the following components of the goods logistics facility:

design properties of a building of the goods logistics facility, geometric and/or functional properties of driving areas and/or transport paths in the goods logistics facility, geometric and/or functional properties of logistics infrastructure elements of the goods logistics facility, geometric and/or functional properties of intralogistics goods transport devices, such as industrial trucks, used in the goods logistics facility, wherein the planning model of the goods logistics facility is created using the data stored in the logistics facility project file, and the logistics facility project file is further used during the life cycle of the goods logistics facility for at least one measure which influences the goods logistics facility with regard to its design, geometric and/or functional properties or monitors it with regard to a state of the goods logistics facility.

Further development options as have already been mentioned with regard to the method for constructing the goods logistics facility also apply to the goods logistics facility itself, and therefore repetitions shall be dispensed with.

The goods logistics facility is further developed in that the logistics facility project file is used for the following measure:

simulating an operation of the goods logistics facility in the planning model of the goods logistics facility, optimizing the planning model of the goods logistics facility based on a result of the simulation, updating the data present in the logistics facility project file on the basis of the results of the optimization, creating a finalized planning model of the goods logistics facility, and storing the model data of the finalized planning model in the logistics facility project file.

According to further development of this embodiment, it is further provided that the logistics facility project file comprises: geometric data describing transport paths to be navigated in the goods logistics facility, and geometric data relating to a plurality of logistics infrastructure elements interacting with the intralogistics goods transport devices, in particular goods transfer stations, charging stations, parking positions, parking spaces and/or storage locations, wherein the logistics facility project file is used to perform a validation of the transport paths to be navigated during the simulation of the operation of the goods logistics facility.

According to another further development of this embodiment, it is further provided that the logistics facility project file is used in order to check, during the validation of the transport paths to be navigated, whether a complete, continuously navigable lane graph can be created, which connects at least some of the logistics infrastructure elements, in particular all logistics infrastructure elements, to one another.

When performing a simulation of the operation of the goods logistics facility, which can be carried out using a control computer provided for the goods logistics facility or another computer, the same or similar advantages can apply as those already explained with regard to the embodiment mentioned with respect to the method.

According to another embodiment, it is further provided that the goods logistics facility is further developed in that the logistics facility project file is used for the following measure:

- creating a material list and/or a list of required construction services for realizing the goods logistics facility using the data stored in the logistics facility project file,
- creating a cost estimate for realizing the goods logistics facility using the material list and/or the list of required construction services.

According to another embodiment, the goods logistics facility is furthermore further developed in that the logistics facility project file can be used in order to execute the following measure: starting an operation of the goods logistics facility, wherein the start of the operation comprises configuring and/or learning of logistics infrastructure elements and/or intralogistics goods transport devices, and configuring and/or learning is carried out using the data present in the logistics facility project file.

According to another embodiment, it is further provided that the goods logistics facility is further developed in that it further comprises a control computer which is set up to carry out the following steps: controlling a running operation of the goods logistics facility, such as an operation of the logistics infrastructure elements and/or the intralogistics goods transport devices, wherein the control computer carries out a control of the goods logistics facility using the data present in the logistics facility project file.

The goods logistics facility thus comprises a control computer which, according to one embodiment, is further set up to carry out the following steps:

- visualizing the goods logistics facility during operation using the data present in the logistics facility project file, wherein
- the logistics facility project file comprises:
- dimensions of the building as design properties of the building,
- dimensions and/or positions of logistics infrastructure elements as geometric properties of the logistics infrastructure elements, and
- dimensions of intralogistics goods transport devices as geometric properties of the intralogistics goods transport devices, wherein
- the control computer carries out the visualization as a graphical representation, wherein
- a geometry of the representation of the building of the goods logistics facility is made taking into account the dimensions of the building, such as in at least approximately true-to-scale representation,
- the graphical representation of the logistics infrastructure elements is made taking into account the dimensions, such as in at least approximately true-to-scale representation, and/or the positions of the logistics infrastructure elements, and
- the graphical representation of the intralogistics goods transport devices is made taking into account the dimensions, in particular in at least approximately true-to-scale representation, of the intralogistics goods transport devices, and wherein further in particular
- the logistics facility project file comprises:
- functional properties of the logistics infrastructure elements and/or intralogistics goods transport devices present in the goods logistics facility, wherein the visualization comprises a representation of a current functional state of the logistics infrastructure elements and/or of the intralogistics goods transport devices, and wherein
- the visualization comprises a representation of a current position and/or of congestion of the intralogistics goods transport devices.

This embodiment can be further developed in that the goods logistics facility further comprises a vehicle control center, wherein the visualization of the goods logistics facility takes place at the vehicle control center coupled to the control computer, and wherein the project file and/or data derived therefrom are either stored in the vehicle control center or transferred to the vehicle control center via a data connection to the control computer.

According to another embodiment, the goods logistics facility is further developed in that it comprises a control computer which is set up to grant an external computer access to the logistics facility project file and/or the data stored in the logistics facility project file and/or data derived or extracted from the logistics facility project file, and the external computer is set up to visualize the goods logistics facility, in particular to visualize a current position of the intralogistics goods transport devices and/or an operating state of the logistics infrastructure elements in order to enable a diagnosis of malfunctions of the goods logistics facility, and/or to perform remote maintenance.

According to another embodiment, the goods logistics facility is further developed in that it comprises a control computer which is set up to use the logistics facility project file for carrying out the following measure: extending and/or modifying the goods logistics facility while adapting the data present in the logistics facility project file, wherein the extension and/or the modification comprises at least one of the following measures:

- adapting geometric data describing the building of the goods logistics facility, in particular dimensions of the building,
- adapting geometric and/or functional properties of the logistics infrastructure elements,
- exchanging and/or supplementing intralogistics goods transport devices or changing a type of intralogistics goods transport devices,
- exchanging and/or supplementing the logistics infrastructure elements,
- changing geometric data describing permitted driving areas and/or transport paths in the goods logistics facility,
- changing geometric data and/or functional data of the logistics infrastructure elements,
- changing geometric data and/or functional data of the intralogistics goods transport devices used in the goods logistics facility.

BRIEF DESCRIPTION OF THE DRAWINGS

Further features will become apparent from the description of embodiments together with the claims and the accompanying drawings. Embodiments can implement individual features or a combination of several features.

The embodiments will be described below without limiting the general inventive idea on the basis of exemplary embodiments with reference to the drawings, wherein reference is expressly made to the drawings with respect to all details according to the present disclosure which are not explained in more detail in the text. Shown are.

In the drawings, in each case identical or similar elements and/or parts are provided with the same reference numbers, so that in each case it is refrained from giving another introduction.

DETAILED DESCRIPTION

Figure 1:
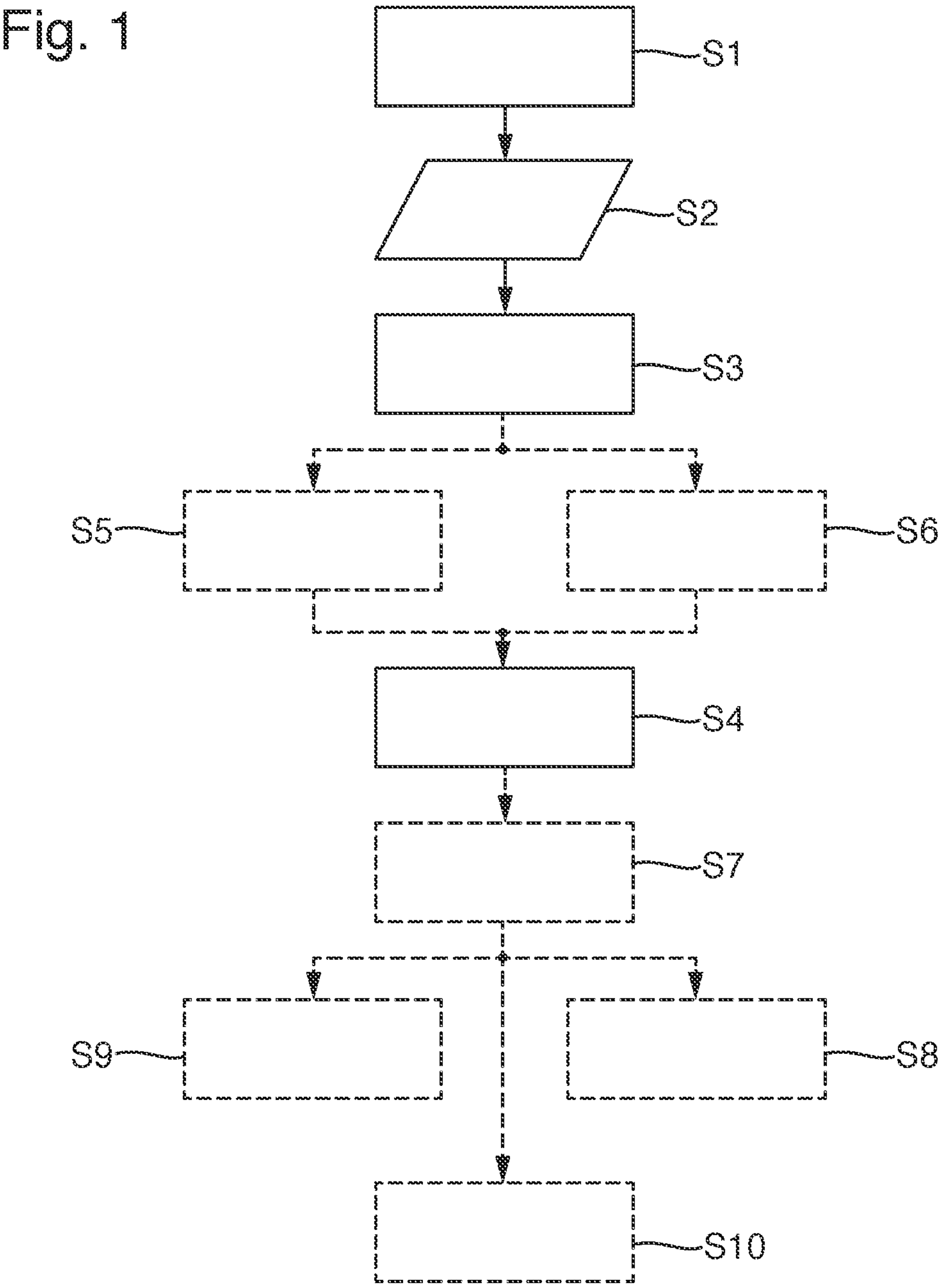
FIG. 1 a flowchart in which individual steps of a method for constructing a goods logistics facility are shown, FIG. 2 a schematic representation of a goods logistics facility, FIG. 3 a schematic representation which illustrates the creation of a planning model of the goods logistics facility using the logistics facility project file, FIG. 4 a schematic representation of the goods logistics facility, wherein a start-up of the goods logistics facility using the logistics facility project file is illustrated, FIG. 5 a schematic illustration of an operation of the goods logistics facility using the logistics facility project file, FIG. 6 a schematic illustration of a use of the logistics facility project file for extending the goods logistics facility, FIG. 7 a schematic illustration of a remote access for the purpose of maintenance the goods logistics facility, on the basis of the logistics facility project file, FIG. 8 an exemplary screen section of a control window of a global traffic control system, FIG. 9 another exemplary screen section in which parameters of a global charging control can be set, FIG. 10 a detailed view of a visualization of a goods logistics facility which shows an operating risk area.
Figure 2:
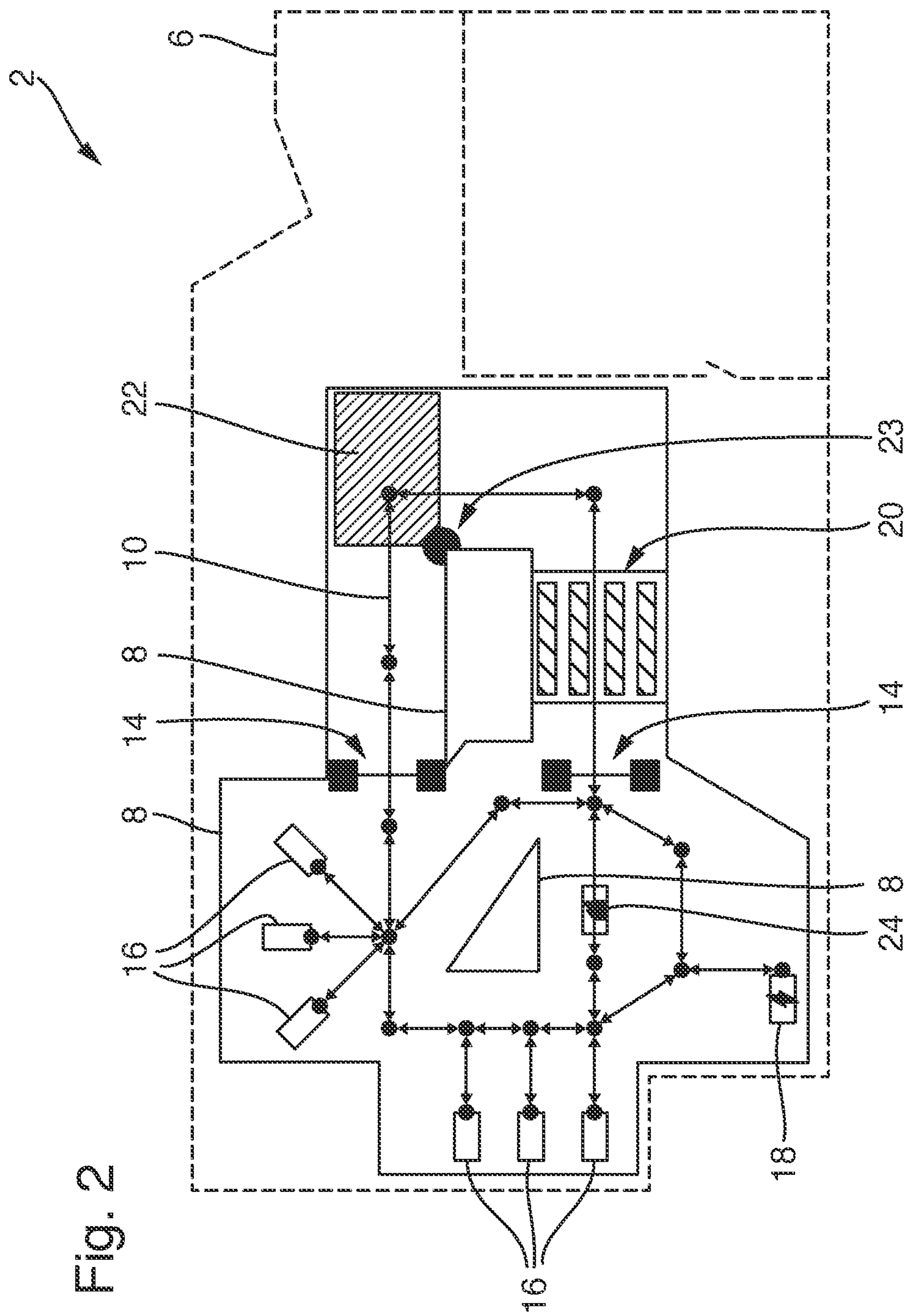

FIG. 1 shows a flowchart in which individual steps of a method for constructing a logistics facility 2 are shown. A schematically simplified representation of the goods logistics facility 2 is shown in FIG. 2.

Figure 3:
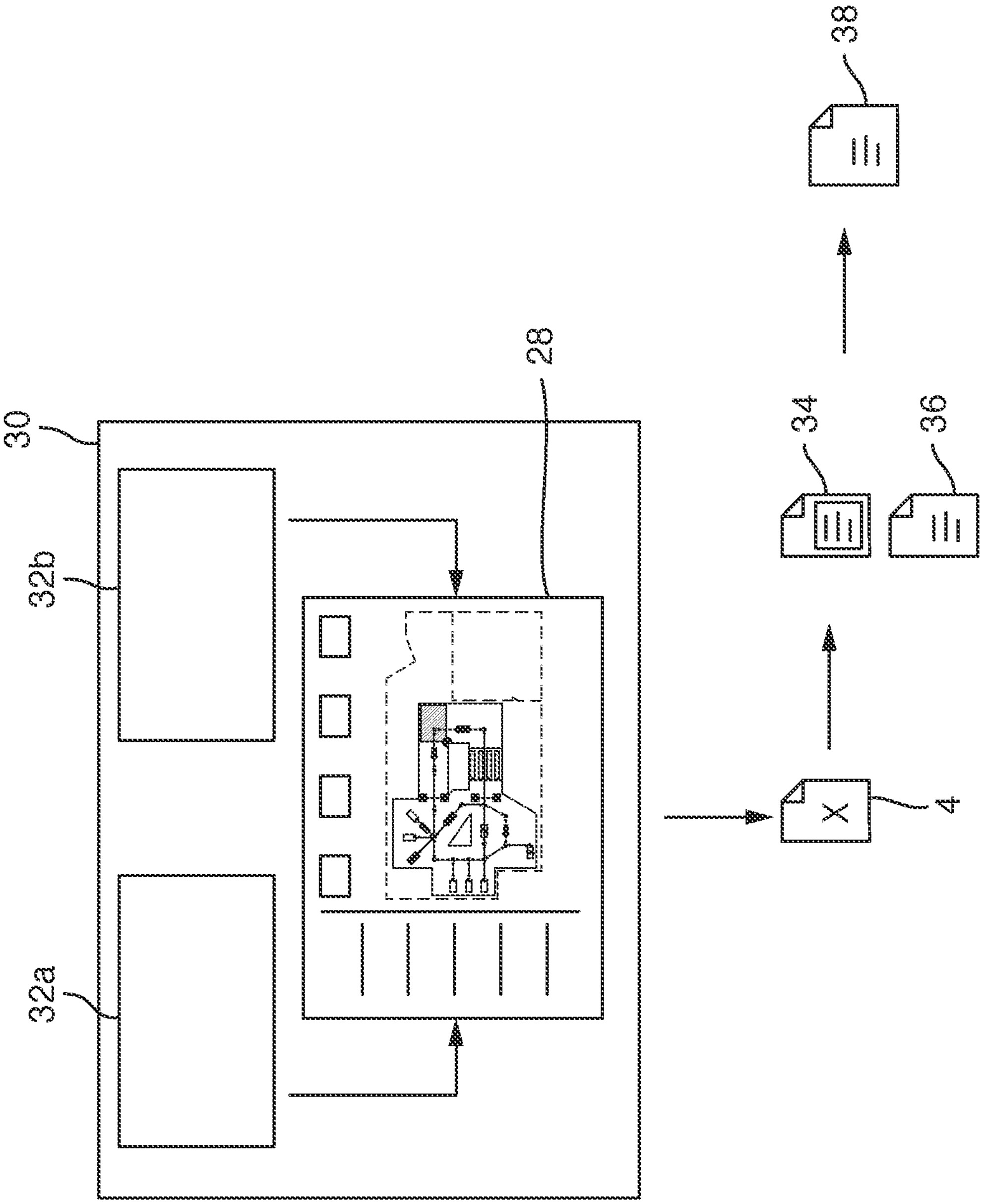

The method begins with the creation (S1) of a logistics facility project file 4 associated with the goods logistics facility 2 (cf. also FIG. 3). In the following, the logistics facility project file 4 will also be referred to as project file 4 for short. Data describing properties of at least one component of the goods logistics facility 2 are inserted into the project file 4 (S2; FIG. 1). Components of the goods logistics facility 2 are, inter alia, a building 6 of the goods logistics facility 2, which is shown in FIG. 2 in the form of a building outline in a dashed line. Another component of the goods logistics facility 2 are driving areas 8 and transport paths 10. In the goods logistics facility 2, as shown in FIG. 2, the driving area 8 is surrounded by the correspondingly referenced polygonal line. Further boundaries of the driving area 8 are located centrally, whereby cutouts of the driving area 8 are defined. The transport paths 10 includes so-called edges of the transport path 10 represented by arrows and nodes of the transport path 10 represented by dots. Transport paths 10 are often also referred to as lanes.

Another component of the goods logistics facility 2 are logistics infrastructure elements 12. By way of example, the goods logistics facility 2 comprises as logistics infrastructure elements 12: rolling gates 14, loading aid stations 16 such as pallet stations, a charging station 18 for charging battery-operated industrial trucks, a pedestrian crossing 20, a zone monitoring area 22, and a home station 24. The charging station 18 comprises a charging device which comprises the charging electronics and provides the current required for charging the industrial truck. The charging station 18 can include further electronic, mechanical or electromechanical components with which an approach and contacting of the industrial truck can be controlled or regulated. Instead of an individual charging station 18, as shown by way of example in the figure, a plurality of charging stations 18 can likewise be arranged accordingly.

Another component of the goods logistics facility 2 are intralogistics goods transport devices 25, which are, for example, industrial trucks 26. In step S2, data describing properties of at least one of the mentioned components of the goods logistics facility 2 is inserted into the project file 4 and stored in the project file 4. Specifically, data describing design properties of the building 6 of the goods logistics facility 2, for example dimensions of the floor plan shown, are inserted into the project file 4. Furthermore, data describing geometric and/or functional properties of the driving areas 8 and/or of the transport paths 10 in the goods logistics facility 2 are inserted into the project file 4. For example, the position of the driving areas 8 and their course is described on the basis of a coordinate system established in the goods logistics facility 2. The transport paths 10 can be defined, for example, using the positions of the nodes represented by dots and the connections possible in each case to the surrounding nodes. Furthermore, data describing geometric and/or functional properties of the logistics infrastructure elements 12 are inserted into the project file 4. For example, the position and size of the rolling gates 14, position and location of the loading aid station 16, a position of the charging station 18, a position and dimension of the pedestrian crossing 20, a position and size of the zone monitoring area 22 including the zone monitoring device 23, and a position and size of the home station 24 are noted. By way of example, the zone monitoring device 23 is shown as a separate unit. The zone monitoring device 23 can, for example, be a sensor unit which optionally has a corresponding evaluation logic. The functionality of the zone monitoring device 23 can also be provided by a central control computer. Functional properties of the logistics infrastructure elements 12 can be, for example, the maximum charging current provided by the charging station 18 or a function of the rolling gates 14, for example whether they open automatically or at what speed or within which time period the rolling gates 14 open or close. Furthermore, data describing geometric and/or functional properties of the intralogistics goods transport devices 25 used in the goods logistics facility 2, for example the industrial trucks 26 used for this purpose, are inserted into the project file 4 and stored therein. Geometric properties are, for example, the dimensions of the industrial trucks 26, functional properties can be, for example, the curve radii navigable by the industrial trucks 26. Based on this information, a planning model of the goods logistics facility 2 is created (S3).

FIG. 3 illustrates the creation of such a planning model using a corresponding planning software 28 which is implemented on a suitable computer 30. In order to generate the project file 4, the aforementioned data describing components of the goods logistics facility 2 are made available as input to the planning software 28. A first data input 32*a* is shown by way of example, with which data relating to design properties of the building 3 of the goods logistics facility 2 and geometric and functional properties of driving areas 8 and transport paths 10 in the goods logistics facility 2 are made available to the planning software 28. In this case, the driving areas 8 and transport paths are created manually, in particular on the basis of background drawings. In a second data input 32*b*, data describing geometric and functional properties of the logistics infrastructure elements 12 and geometric and functional properties of the intralogistics goods transport devices 25 used are entered.

Next in the flowchart of FIG. 1 follow optional steps, which will be explained at a later point in time. Steps that can be carried out during the service life of the goods logistics facility 2 are shown in dashed lines. As the next step therefore follows S4, the realization of the goods logistics facility 2 on the basis of the planning model created in step S3 and using the data stored in the project file 4. The steps shown in dashed lines in the flowchart of FIG. 1 are measures that can be carried out during the life cycle of the goods logistics facility 2. These measures change the geometric and/or functional properties of the goods logistics facility 2 or monitor the goods logistics facility 2 with regard to its state. The measures carried out during the life cycle of the goods logistics facility 2 are carried out using the data stored in the project file 4. It is possible for these method steps shown in dashed lines, each of which per se illustrate a further measure which changes or visualizes the goods logistics facility 2 with regard to its geometric and/or functional properties, to be carried out repeatedly or iteratively. For reasons of clarity, the corresponding arrows, which illustrate those relationships between the further measures, should be omitted from the illustration.

For example, as shown in FIG. 3, a material list 34 and a list 36 of required construction services, which are required for realizing the goods logistics facility 2, are created using the data stored in the project file 4. A cost estimate 38 for realizing the goods logistics facility 2 is in turn created from the material list 34 and the list 36 of the required construction services. The creation of the material list 34 and the list 36 of the required construction services and the creation of the cost estimate 38 should be carried out under step S5 which is characterized as an optional step in FIG. 1. Such a step can take place before the goods logistics facility 2 is realized (S4). However, it is also possible that the creation of a material list 34 and a list 36 of the required construction services and the creation of a cost estimate 38 are carried out within the scope of an extension or a conversion of the goods logistics facility 2 (change request). In addition, a simulation of the goods logistics facility 2 can be performed in the planning software 28. Such a simulation of the operation of the goods logistics facility 2 shall be referred to as an optional step S6 in FIG. 1. As shown in the FIG., steps S5 and S6 can be carried out in parallel or one after the other, wherein the order is not fixed. Step (S6), i.e., a simulation, can also carried out before the goods logistics facility 2 is realized (S4). The simulation of the goods logistics facility 2 takes place in the planning model of the goods logistics facility 2. This planning model can be optimized based on the results of the simulation. Accordingly, the data present in the project file 4 are updated using the result of this optimization. Subsequently, a finalized planning model of the goods logistics facility 2 is created. The model data of the finalized planning model are stored in the project file 4.

As already mentioned further above, it is possible to iterate steps S5 and steps S6, for example. In other words, for example, in each case a material list 34 can thus be created iteratively one after the other (step S5), on the basis of which, for example, a cost estimate can also be created, and subsequently (step S6) a simulation of the goods logistics facility 2 is carried out. The layout of the goods logistics facility 2 can be adapted on the basis of the result of the simulation. A changed layout means, for example, a reduction in the number of industrial trucks, which then in turn leads to a change in the material list 34, etc.

As part of the modeling, data in the project file 4 is taken into account, which describe the geometry of the transport paths 10 to be navigated and geometric data on the logistics infrastructure elements 12 which interact with the intralogistics goods transport devices 25. Logistics infrastructure elements 12 which are taken into account as part of the simulation of the goods logistics facility 2 are, for example, loading aid stations 16 as goods transfer stations, charging stations 18, parking positions, parking spaces and/or storage locations. The step of simulation includes in particular a simulation of the operation of the goods logistics facility 2 by performing a validation of the transport paths 10 to be navigated. During the validation of the transport paths 10 to be navigated, it is checked whether a complete, continuously navigable lane graph, such as the one shown in FIG. 2, can be created. If possible, this lane graph should connect or intersect all logistics infrastructure elements 12. If the logistics infrastructure element 12 is, for example, a charging station 18, the lane graph would have to be connected thereto. If, however, the logistics infrastructure element 12 is a gate, it would have to intersect the corresponding element.

In addition, as part of the simulation, it can be determined whether the specifications for the goods logistics facility 2 to be realized are met with regard to the planned goods throughput. According to the result of the simulation, the number and/or the type of the goods transport devices used, for example, the required industrial trucks 26, the arrangement of the transport paths, and/or the arrangement and/or the type of the logistics infrastructure elements 12 used can then be adapted.

Figure 4:
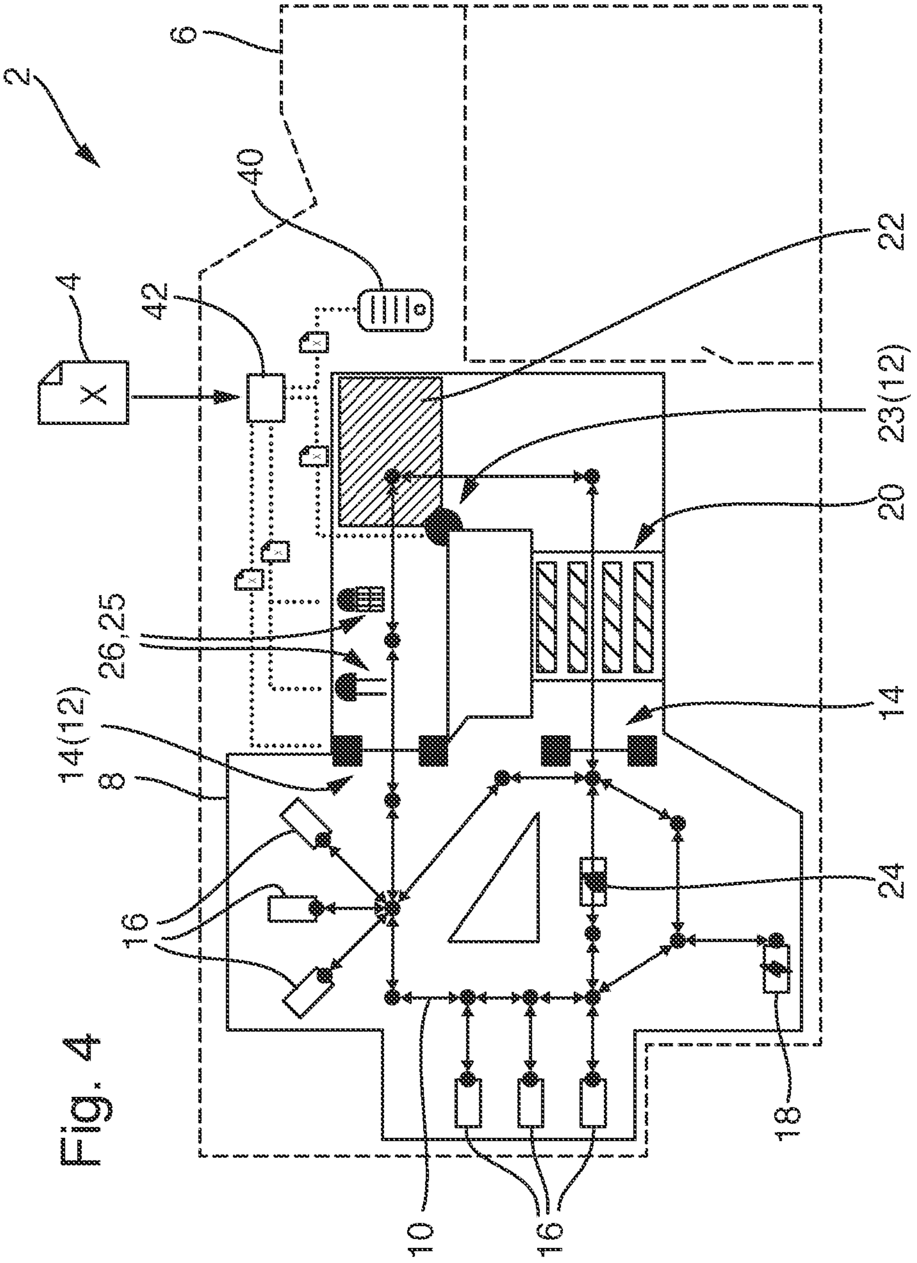

FIG. 4 shows the schematic representation of the goods logistics facility 2 from FIG. 2. Identically shown elements of the goods logistics facility 2 already explained in conjunction with FIG. 2 will not be explained again. The start of the operation is illustrated in FIG. 1 with the optionally shown method step S7. The start of the operation of the goods logistics facility 2 takes place using the data stored in the project file 4. A configuration of logistics infrastructure elements 12 and of intralogistics goods transport devices 25 is carried out; in this case the devices can be autonomous or automatically guided intralogistics goods transport devices 25. As logistics infrastructure elements 12, by means of data stored in the project file 4 or data extracted therefrom, by way of example the rolling gate 14 and the zone monitoring device 23 are configured and taught. In this context, for example, the size and position of the zone monitoring area 22 spanned by the zone monitoring device 23 can be taken from the data stored in the project file 4. Furthermore, by means of data stored in the project file 4 or extracted therefrom, the industrial trucks 26 as well as the mobile terminal 40 are configured and trained, or the mobile terminal 40 is granted access to the project file 4 or to data derived therefrom. Specifically, the application can be configured on the control computer for guided start-up on the basis of the project file 4. For example, a mobile technician workstation calls up an application, such as a web application or the like, during the step-by-step start-up. This application in turn accesses the data of the logistics facility project file 4 or data derived therefrom, wherein the project file 4 is still hosted by a control computer 42. In this way, the mobile terminal 40 is used, for example, for guided start-up. For this process, i.e., of starting (S7) an operation of the goods logistics facility 2, the project file 4 is transferred, for example, to a control computer 42 of the goods logistics facility 2. The communication of the data, shown in FIG. 4 by dotted line, takes place via suitable data connections, which can be wired or wireless data connections.

After start-up, the control of the goods logistics facility 2 can take place on the basis of the data stored in the project file 4. The control of the running operation is also summarized in step S7 in the flowchart of FIG. 1.

Figure 5:
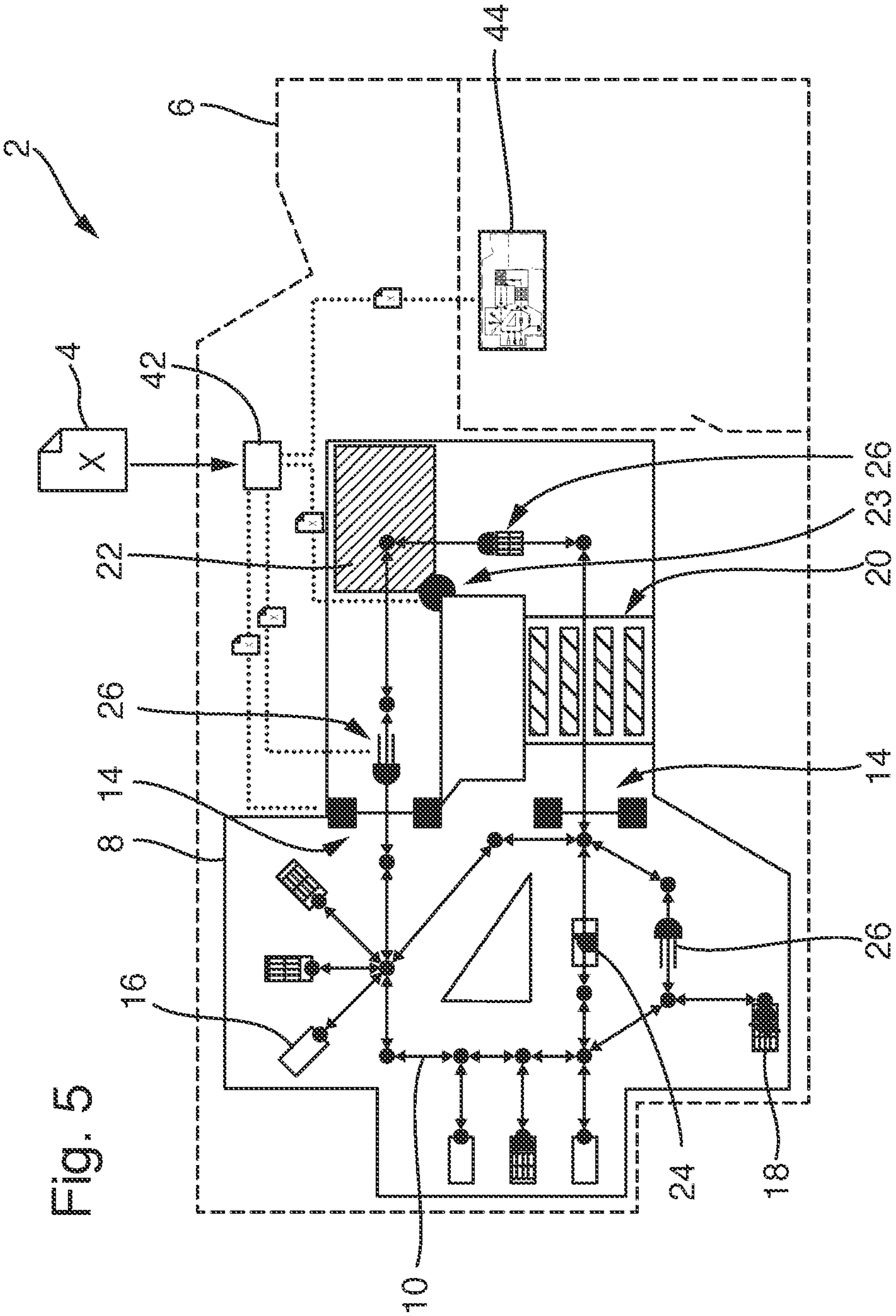

FIG. 5 shows this control. The representation in FIG. 5 corresponds to that of FIG. 4; only deviating elements shall be expressly mentioned and described.

The control of the operation of the goods logistics facility 2 illustrated in FIG. 5 is carried out by the control computer 42, which is connected to a vehicle control center 44. Again, a suitable data connection is illustrated via a dotted line; it can be a wired or wireless data connection. For controlling the operation, the control computer 42 is, by way of example, in data connection to the rolling gate 14, an industrial truck 26, and the zone monitoring device 23. As already mentioned further above, the zone monitoring device 23 can be a sensor or the like, while the actual functionality of the zone monitoring is provided by the control computer 42. Alternatively, the control computer 42 can assume the function of zone monitoring, provided that the positions of the industrial trucks 26 are known. The positions of the industrial trucks 26 can, for example, be detected by means of sensors on the vehicles and transferred cyclically to the control computer 42. According to a further exemplary embodiment, it is thus not necessary for the zone monitoring device 23 to comprise a sensor. In contrast to the representation of FIG. 4, in FIG. 5 there are three industrial trucks on the loading aid stations 16, of which only one is provided with a reference sign for reasons of clarity. The loading aids are pallets, for example, such that the loading aid stations can be pallet stations, for example. In addition, an industrial truck 26 is charged at the charging station 18. While two of the industrial trucks 26 that are in motion are shown empty, the industrial truck 26 shown on the right near the zone monitoring area 22 is shown loaded. The control of the running operation of the goods logistics facility 2 comprises in particular a control of the logistics infrastructure elements 12 and of the intralogistics goods transport devices 25. For this purpose, the project file 4 or data extracted therefrom is present on the control computer 42 for controlling the goods logistics facility 2.

Controlling the goods logistics facility 2 can be visualized, as indicated on the vehicle control center 44. A visualization is shown as an optional method step S8 in FIG. 1. The visualization of the goods logistics facility 2 in operation is carried out using the data present in the project file 4. The visualization takes place as a graphical representation, wherein, for example, the floor plan of the building 6 is shown. In the visualization, a geometry of the building 6 can be taken into account. Furthermore, the visualization, similar to that shown in FIGS. 2 to 7, comprises a graphical representation of the logistics infrastructure elements 12. Here too, dimensions and size ratios can be taken into account in the visualization. Furthermore, the visualization comprises a graphical representation of the intralogistics goods transport devices 25, for example of the industrial trucks used. Here again, size ratios and dimensions can be taken into account in the visualization. Furthermore, functional properties of both the logistics infrastructure elements 12 and the intralogistics goods transport devices 25 can be taken into account in the visualization. For example, the illustration, as shown in FIGS. 2 to 7, indicates whether or not an industrial truck 26 is loaded as an exemplary intralogistics goods transport device 25. Furthermore, a current position and a state, for example loaded or unloaded, of the intralogistics goods transport devices 25 are indicated. For example, it can be indicated in which segment between which waypoints an industrial truck 26 is currently located. Also, an operating state can be indicated, for example whether there is a malfunctions or, for example, whether the industrial truck 26 has a low battery level. Visualization takes place, for example, at the vehicle control center 44 or also on an external computer. For the latter purpose, the control computer 42 allows the external computer to access the project file 4. For example, the visualization on the control computer 42 is provided as a web application. The external computer accesses the web application provided by the control computer 42 via a browser. For this purpose, data stored in the project file 4, data derived therefrom, or data extracted therefrom are stored in the vehicle control center 44 or can be transferred to the vehicle control center 44 via the data connection shown between the vehicle control center 44 and the control computer 42. The same applies to an external computer.

Figure 6:
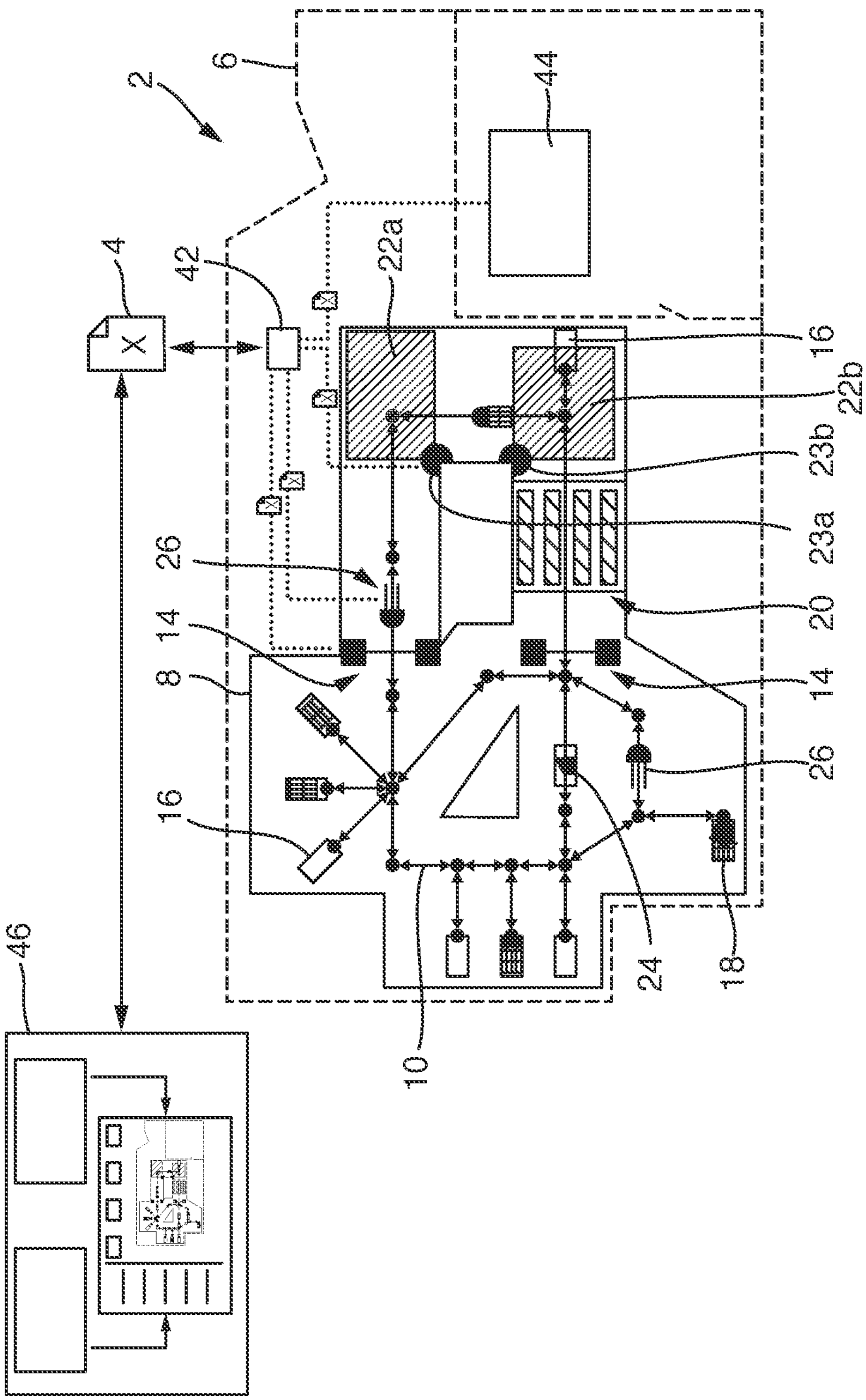

FIG. 6 shows the goods logistics facility 2 which has been extended compared to the goods logistics facility 2 from FIG. 5. A second zone monitoring device **23*b* has been added, which spans a second zone monitoring area 22*b*. The previous zone monitoring device is now a first zone monitoring device 23*a* that spans a first zone monitoring area 22*a*. Another loading aid station 16 is also located partially within this second zone monitoring area 22*b*. In order to extend or modify the goods logistics facility 2, the control computer 42 allows the external computer 46 to access the project file 4. Thus, an extension or modification of the goods logistics facility 2 can be carried out by means of the external computer 46 similarly to the planning performed in conjunction with FIG. 2, but only for the elements to be extended, wherein an adaptation is subsequently made in project file 4 such that it now also comprises the data added as part of the modification. This modification comprises, for example, an adaptation of geometric data describing the building 6, an adaptation of geometric and/or functional properties of logistics infrastructure elements 12, the exchange or the supplementation of intralogistics goods transport devices 25 or a change of a type of the intralogistics goods transport devices 25 used, for example a newer type of industrial truck 26. Furthermore, the modification comprises, for example, the exchange or the supplementation of logistics infrastructure elements 12, such as a rolling gate 14, or just the addition of the second zone monitoring device 23*b* while incorporating the second zone monitoring area 22*b* into the structure of the goods logistics facility 2. This can also result in a change in the permitted driving areas 8 or transport paths 10**.

Figure 7:
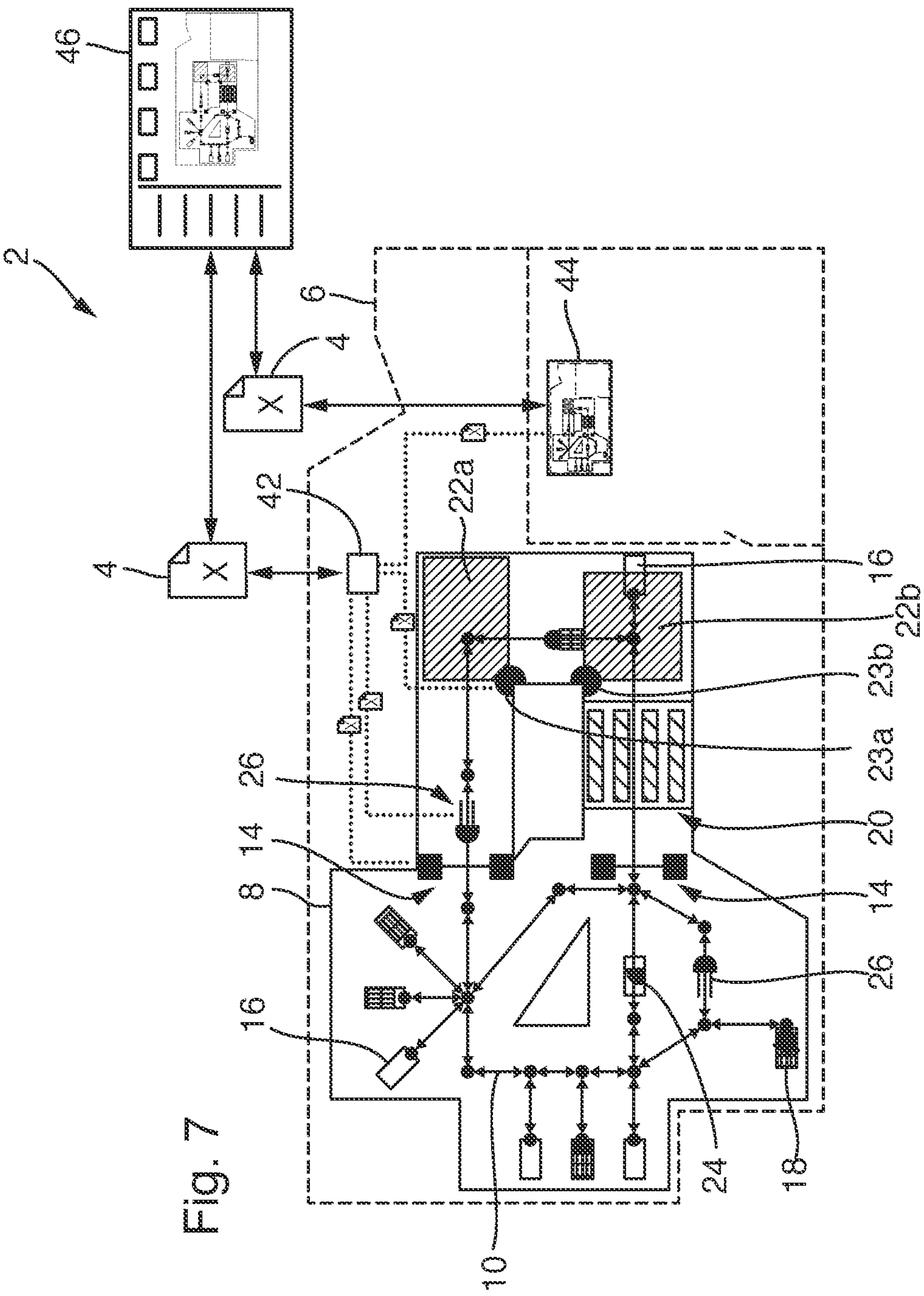

FIG. 7 shows a schematic illustration of the goods logistics facility 2 from FIG. 6, i.e., including the extension carried out. In this case, the external computer 46 is not used to plan an extension of the goods logistics facility 2, but rather to perform remote maintenance. While the extension in the flowchart of FIG. 1 shall be referred to as step S9, performing remote maintenance is referred to as step S10. Steps S8, S9 and S10 are equivalent in the flowchart; no special order of carrying out these steps is provided.

When performing remote maintenance, the control computer 42 grants the external computer 46 access to the project file 4. For example, the logistics facility project file 4 is stored on the control computer 42. Any other computer that has access to the control computer 42 or to the services provided by it can request this project file 4, which requires a prior successful authentication of the other computer. If the project file 4 is stored in the vehicle control center 44, the vehicle control center 44 can also be set up to grant access to the project file 4 in the external computer 46. Performing remote maintenance comprises in particular the visualization of the goods logistics facility 2 on the external computer 46. The detailed visualization including the functionalities allows a comprehensive analysis of the state of the goods logistics facility 2 and thus the performance of remote diagnostics.

When carrying out a measure which influences the goods logistics facility 2 with regard to its design, geometric and/or functional properties or which monitors a state of the goods logistics facility 2, and which is carried out during the life cycle of the goods logistics facility 2, data are read out from the logistics facility project file 4 or data are derived from the data stored in this file. These data are transferred between individual units of the goods logistics facility 2.

The data taken from the logistics facility project file 4 (wherein data derived therefrom are also meant, without this being explicitly mentioned repeatedly below) can, for example, be transferred to logistics infrastructure elements 12 and/or to intralogistics goods transport devices 25. Alternatively, the configuration, i.e., the data of the logistics infrastructure elements 12, such as gates and the like, taken from the logistics facility project file 4, which must be taken into consideration during control, can also be taken into account by the control computer. In this case, the data are thus taken into account during their control by mapping the corresponding logic via the control computer 42. Such data transfer can be carried out for various purposes. The data transfer takes place as part of the implementation of the further measure described above.

For example, the positioning types of the loading aids used in the goods logistics facility 2 can be defined in the logistics facility project file 4. For example, it is specified that Euro-pallets, industrial pallets and roller containers are used in the goods logistics facility 2. These positioning types, including the associated dimensions, are read out from the logistics facility project file 4 by the control computer 42 when the project is transferred, i.e., for example, during start-up of the goods logistics facility 2 or during control of the operation of the goods logistics facility 2. The data can be managed in transformed version and can be taken into account or used during execution, i.e., during the control of the running operation of the goods logistics facility 2.

The positioning type of the loading aid can also be taken into account during the control of the running operation of the goods logistics facility 2 by the control system, i.e., by the control computer 42 which controls the running operation of the goods logistics facility 2. For example, the process of transporting goods can be calculated and planned taking into account the loading aids used.

The positioning type can also be communicated to an intralogistics goods transport device 25, for example to an industrial truck, upon transfer of a transport order, i.e., can be transferred from the control computer 42 to the intralogistics goods transport device 25. This enables the industrial truck to pick up the loading aid in a suitable manner according to its type. This is because different positioning types require a different pickup or approach for pickup by the industrial truck. If necessary, the transport path can also be planned and carried out taking into account the size of the loading aid used. Alternatively, this can also be transferred to the vehicle as generally valid configuration information if, for example, only a single positioning type is used.

Furthermore, for example, data relating to a layout of the driving areas, i.e., data describing the position and/or dimensions of the driving areas can be stored in the logistics facility project file 4. During another measure, these data are read out from the logistics facility project file 4, for example during start-up of the goods logistics facility 2. The data can be managed in transformed version and can be taken into account or used during execution, i.e., during the control of the running operation of the goods logistics facility 2.

For example, a driving area is created during planning and subsequently validated in the simulation. The results of the simulation can then result in an adaptation which leads to an optimization of the goods logistics facility 2. The associated data are stored in the goods logistics facility project file 4. Furthermore, the layout of the driving areas or the data on which this layout is based, which is stored in the logistics facility project file 4, can also be transferred to an intralogistics goods transport device 25, for example to an industrial truck. Thus, the intralogistics goods transport device 25 is enabled to decide in which area within the goods logistics facility 2 it can move, and where and to what extent safety distances, for example to fixed objects, have to be complied with. The safety distances can also be integrated into such a layout.

According to another example, data relating to the global traffic control within the goods logistics facility 2 can be stored in the logistics facility project file 4.

Figure 8:
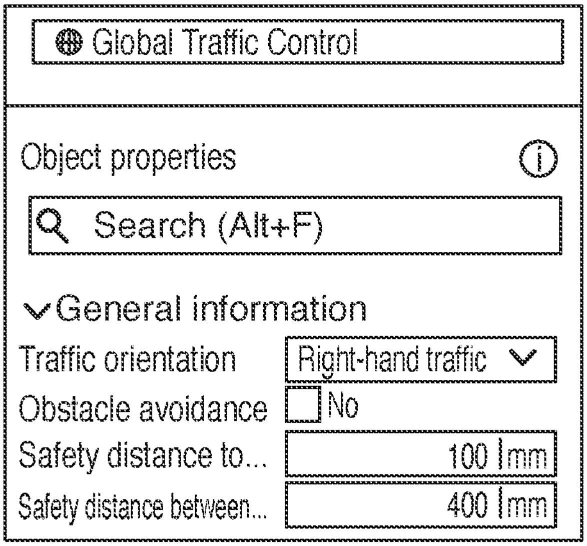

FIG. 8 shows by way of example a screen window of this global traffic control, as displayed, for example, during a planning of the goods logistics facility 2 on a display of the computer 30 on which the planning software is running. The settings are made in advance in the planning software and then taken into account during running operation. However, it is also possible to display the settings during running operation. For example, based on the data stored in the goods logistics facility project file 4, it is specified that the general traffic orientation within the goods logistics facility 2 is "right-hand traffic." Obstacle avoidance can be prevented by selecting the corresponding field. An exemplary safety distance of 100 mm is maintained from stationary objects. This distance can also be 500 mm. The safety distance from moving objects is 400 mm.

All of these rules and data can be stored in the logistics facility project file 4 and can be read out from the project file 4, for example during start-up of the goods logistics facility 2 or during implementation of a control of the running operation of the goods logistics facility 2 by the control computer 42. The data can also be managed in transformed form and can be taken into account or used during execution, i.e., during the control of the running operation of the goods logistics facility 2.

Furthermore, the global traffic control rules can be transferred, for example during start-up of an intralogistics goods transport device 25, from the control computer 42 to an intralogistics goods transport device 25, for example an industrial truck. The intralogistics goods transport device 25 will then behave in accordance with the global traffic control rules in the goods logistics facility 2, for example the general right-hand traffic and the required safety distances to stationary and moving obstacles.

Further data that can be read out from the goods logistics facility project file 4 or that can be derived from the data stored in this file relate to the global charging strategy, for example for battery-operated intralogistics goods transport devices 25, such as, for example, electrically driven industrial trucks.

Figure 9:
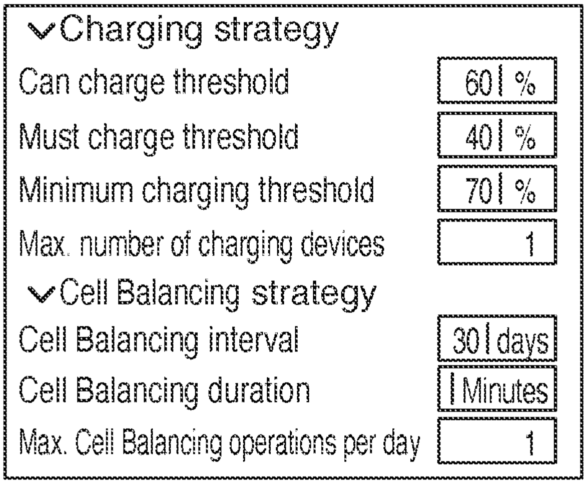

FIG. 9 again shows a screen section in which a control window is shown. For example, the control window may be displayed on a display of the control computer 42 during a control of the running operation of the goods logistics facility 2. However, these settings can also be made in advance in the planning software and are then taken into account during running operation.

According to a further example, data relating to a global charging strategy for intralogistics goods transport devices 25 present in the logistics facility, such as battery-operated industrial trucks, can be stored in the logistics facility project file 4.

Different charging thresholds are specified for electrically operated industrial trucks 26. From a can charge threshold, which is 60% of the maximum battery charge, the industrial truck 26 can charge the traction battery, for example. For example, the control computer 42 creates a "charging order" for the specific industrial truck 26 such that the industrial truck 26 approaches the charging station 18. Accordingly, no transport orders are planned for this industrial truck 26. From the must charge threshold, which is 40%, it is necessary for the industrial truck 26 to approach a charging station 18. The specified minimum charging threshold of 70% defines the state of charge up to which the industrial truck has to remain at the charging station 18 in any case before it resumes operation.

It is also specified that a maximum of one industrial truck 26 is charged at a charging station 18. This is indicated by the parameter "maximum number of charging devices." This number is selected, for example, such that the operation is not impaired by too many industrial trucks 26 being in the charging process at the same time. Furthermore, the cell balancing strategy, for example for the traction battery, is also defined. By way of example, a cell balancing is performed every 30 days, which is defined by the value of the "cell balancing interval" parameter. It is also established that a maximum of one device and thus, for example, a single industrial truck 26 can perform on cell balancing operation per day. Here, too, it is important that not all industrial trucks 26 are not used at the same time or on the same day for the duration of the cell balancing operation. This is a global setting which is not specific to the charging station 18.

All of the above-mentioned parameters can be stored in the logistics facility project file 4 and can be read out, for example during start-up or during control of the running operation of the goods logistics facility 2 by the control computer 42. The control computer 42 takes these specifications into account in relation to the charging behavior of the electrically operated industrial trucks present in the goods logistics facility 2. In addition, the state of charge of the industrial trucks can be taken into account with regard to the global charging strategy mentioned above for the granting of corresponding charging and transport orders. For example, charging orders can be assigned to industrial trucks in such a way that the charging processes, for example of the traction battery, are scheduled between two transport orders.

According to a further example, data relating to the layout of an operating risk area, i.e., for example its position and dimensions, can be stored in the logistics facility project file 4.

The term "operating risk area" can be used to describe those areas which represent a risk for pedestrians when entered. This risk arises, for example, in that an industrial truck, for example to enter a station, has to deactivate or reduce the protection fields. In this state, the industrial truck can no longer recognize a person and therefore cannot stop automatically either. The option to take such areas into account, for example when planning, simulating and optimizing the goods logistics 2, is provided. The data describing operating risk areas can be integrated into the goods logistics facility project file 4.

Operating risk areas initially do not have any direct effects on the control of the running operation of the goods logistics facility, the behavior of the intralogistics goods transport devices present in the goods logistics facility, in particular industrial trucks, or the implementation of transport orders and the like, i.e., generally the navigation of intralogistics goods transport devices 25 in the goods logistics facility 2. However, they can be important for the visualization and optimization of the goods logistics facility 2.

Figure 10:
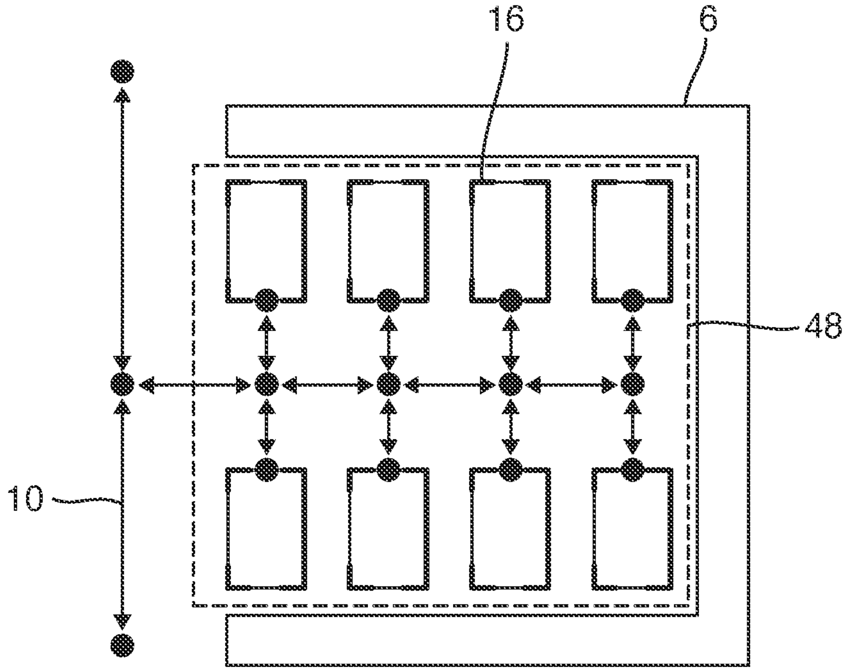

FIG. 10 shows a detailed view of a visualization of a goods logistics facility 2, wherein an operating risk area 48 within a building 6 is shown. A plurality of loading aid stations 16, for example pallet stations, are located in the operating risk area 48. The associated lane graph is also shown. For example, a pallet pick-up takes place in the loading aid stations 16. The moment an industrial truck picks up a pallet, it must of course switch off or reduce its protective fields at least in the direction of the load handling means, as otherwise the corresponding protective fields would prevent the load handling means, for example a load fork, from being moved into the pallet. In this respect, there is an increased risk for pedestrians in the operating risk area 48, as the industrial trucks are operated with deactivated protection fields.

The operating risk areas 48 initially have no direct influence on the immediate operating control of the goods logistics facility 2. However, when visualizing the goods logistics facility 2, these can be of great importance, because it is the task of the operator of the goods logistics facility 2 on site, for example to provide appropriate floor markings and to train the employees accordingly in order to prevent any possible hazards.

Embodiments according to the present disclosure can be implemented by individual features or a combination of multiple features.

LIST OF REFERENCE NUMBERS

- 2 Goods logistics facility
- 4 Logistics facility project file
- 6 Building
- 8 Driving areas
- 10 Transport path
- 12 Logistics infrastructure element
- 14 Roller gate
- 16 Loading aid station
- 18 Charging station
- 20 Pedestrian crossing
- 22 Zone monitoring area
- 22*a* first zone monitoring area
- 22*b* second zone monitoring area
- 23 Zone monitoring device
- 23*a* first zone monitoring device
- 23*b* second zone monitoring device
- 24 Home station
- 25 Intralogistics goods transport devices
- 26 Industrial truck
- 28 Planning software
- 30 Computer
- 32*a*, 32*b* Data input
- 34 Material list
- 36 List of construction services
- 38 Cost estimate

40 Mobile terminal
42 Control computer
44 Vehicle control center
46 External computer
48 Operating risk area

What is claimed is:

1. A method, performed by one or more computers, for constructing a goods logistics facility, the method comprising:

creating a logistics facility project file associated with the goods logistics facility;

inserting and storing data in the logistics facility project file, the data describing properties of the following components of the goods logistics facility in the logistics facility project file:

design properties of a building of the goods logistics facility;

geometric and/or functional properties of transport paths in the goods logistics facility;

geometric and/or functional properties of logistics infrastructure elements of the goods logistics facility; and geometric and/or functional properties of intralogistics goods transport devices used in the goods logistics facility, the intralogistics goods transport devices including industrial trucks;

creating a planning model of the goods logistics facility using the data stored in the logistics facility project file;

controlling a display to display a graphical representation of the planning model of the goods logistics facility, based on the data stored in the logistics facility project file;

simulating an operation of the goods logistics facility in the planning model and automatically optimizing the planning model based on a result of the simulation by performing one more times:

validating, based on the data describing the geometric and/or functional properties of the transport paths and the geometric and/or functional properties of the logistics infrastructure elements, whether a complete, continuously navigable lane graph can be created which:

connects one or more of the logistics infrastructure elements of a first type; and intersects one or more of the logistics infrastructure elements of a second type; and validating, based on the data describing the geometric and/or functional properties of the transport paths and the geometric and/or functional properties of the intralogistics goods transport devices, whether a prescribed distance to a non-driving area is maintained for the industrial trucks; and automatically optimizing the planning model to attempt to create the complete, continuously navigable lane graph and to maintain the prescribed distance to the non-driving area for the industrial trucks;

updating the data present in the logistics facility project file based on a result of the automatically optimizing the planning model;

generating traffic control rules for one or more of the industrial trucks to navigate an actual complete, continuously navigable path in the goods logistics facility constructed according to the updated data present in the logistics facility project file and to maintain the prescribed distance to the non-driving area in the goods logistics facility; and controlling the one or more of the industrial trucks by wired or wireless data connections based on the traffic control rules to move along the actual complete, continuously navigable path and to maintain the prescribed distance to the non-driving area.

2. The method according to claim 1, further comprising:

creating a material list and/or a list of required construction services for realizing the goods logistics facility using the data stored in the logistics facility project file; and creating a cost estimate for realizing the goods logistics facility using the material list and/or the list of required construction services.

3. The method according to claim 1, further comprising:

starting an operation of the goods logistics facility, wherein the starting of the operation of the goods logistics facility comprises configuring and/or teaching of the logistics infrastructure elements and/or of the intralogistics goods transport devices, and the configuring and/or teaching is carried out using the data present in the logistics facility project file.

4. The method according to claim 1, further comprising:

controlling a running operation of the goods logistics facility, the running operation including an operation of the logistics infrastructure elements and/or the intralogistics goods transport devices; and carrying out a control of the goods logistics facility using the data present in the logistics facility project file.

5. The method according to claim 4, further comprising:

controlling the display to display a visualization of the goods logistics facility during the operation using the data present in the logistics facility project file or data derived therefrom, wherein the logistics facility project file comprises:

dimensions of the building as design properties of the building;

dimensions and/or positions of logistics infrastructure elements as geometric properties of the logistics infrastructure elements; and dimensions of intralogistics goods transport devices as geometric properties of the intralogistics goods transport devices, wherein the visualization comprises:

a graphical representation of the building of the goods logistics facility, wherein a geometry of the graphical representation of the building takes into account the dimensions of the building, in at least approximately true-to-scale representation;

a graphical representation of the logistics infrastructure elements, wherein a geometry of the graphical representation of the logistics infrastructure elements takes into account the dimensions of the logistics infrastructure elements, in at least approximately true-to-scale representation, and/or the positions of the logistics infrastructure elements; and a graphical representation of the intralogistics goods transport devices, wherein a geometry of the graphical representation of the intralogistics goods transport devices takes into account the dimensions of the intralogistics goods transport devices, in at least approximately true-to-scale representation, wherein the logistics facility project file comprises functional properties of the logistics infrastructure elements and/or the intralogistics goods transport devices present in the goods logistics facility, and wherein the method further comprises controlling the display to display:

a representation of a current functional state of the logistics infrastructure elements and/or of the intralogistics goods transport devices; and a representation of a current position and/or of congestion of the intralogistics goods transport devices.

6. The method according to claim 1, further comprising: controlling the display to display a current position of the intralogistics goods transport devices and/or an operating state of the logistics infrastructure elements in order to enable a diagnosis of malfunctions of the goods logistics facility.

7. The method according to claim 4, further comprising: performing remote maintenance of the goods logistics facility during operation, based on the logistics facility project file and/or the data stored in the logistics facility project file and/or data derived or extracted from the logistics facility project file.

8. The method according to claim 1, further comprising: extending and/or modifying the planning model of the goods logistics facility while adapting the data present in the logistics facility project file, wherein the extending and/or the modifying of the planning model comprises:

adapting geometric data;

describing dimensions of the building of the goods logistics facility;

adapting the geometric and/or functional properties of the logistics infrastructure elements;

exchanging and/or supplementing intralogistics goods transport devices or changing a type of the intralogistics goods transport devices;

exchanging and/or supplementing the logistics infrastructure elements;

changing geometric data describing permitted transport paths in the goods logistics facility;

changing the geometric data and/or functional data of the logistics infrastructure elements; and changing geometric data and/or functional data of the intralogistics goods transport devices used in the goods logistics facility.

9. The method according to claim 1, further comprising: controlling the display to display a graphical representation of the planning model of the goods logistics facility that was automatically optimized, based on the updated data stored in the logistics facility project file.

10. A non-transitory computer-readable storage medium storing instructions for constructing a goods logistics facility, the instructions causing one or more computers to at least:

create a logistics facility project file associated with the goods logistics facility;

insert and store data describing properties of the following components of the goods logistics facility in the logistics facility project file:

geometric and/or functional properties of transport paths in the goods logistics facility;

geometric and/or functional properties of logistics infrastructure elements of the goods logistics facility; and geometric and/or functional properties of intralogistics goods transport devices used in the goods logistics facility, the intralogistics goods transport devices including industrial trucks;

create a planning model of the goods logistics facility using the data stored in the logistics facility project file;

control a display to display a graphical representation of the planning model of the goods logistics facility, based on the data stored in the logistics facility project file;

simulate an operation of the goods logistics facility in the planning model and automatically optimizing the planning model based on a result of the simulation by performing one more times:

validate, based on the data describing the geometric and/or functional properties of the transport paths and the geometric and/or functional properties of the logistics infrastructure elements, whether a complete, continuously navigable lane graph can be created which:

connects one or more of the logistics infrastructure elements of a first type; and intersects one or more of the logistics infrastructure elements of a second type; and validate, based on the data describing the geometric and/or functional properties of the transport paths and the geometric and/or functional properties of the intralogistics goods transport devices, whether a prescribed distance to a non-driving area is maintained for the industrial trucks; and automatically optimize the planning model to attempt to create the complete, continuously navigable lane graph and to maintain the prescribed distance to the non-driving area for the industrial trucks;

update the data present in the logistics facility project file based on a result of the automatically optimizing the planning model;

generate traffic control rules for one or more of the industrial trucks to navigate an actual complete, continuously navigable path in the goods logistics facility constructed according to the updated data present in the logistics facility project file and to maintain the prescribed distance to the non-driving area in the goods logistics facility; and control the one or more of the industrial trucks by wired or wireless data connections based on the traffic control rules to move along the actual complete, continuously navigable path and to maintain the prescribed distance to the non-driving area.

11. A system for constructing a goods logistics facility comprising:

one or more processors configured to:

create a logistics facility project file associated with the goods logistics facility;

insert and store data describing properties of the following components of the goods logistics facility in the logistics facility project file:

design properties of a building of the goods logistics facility;

geometric and/or functional properties of transport paths in the goods logistics facility;

geometric and/or functional properties of logistics infrastructure elements of the goods logistics facility; and geometric and/or functional properties of intralogistics goods transport devices used in the goods logistics facility, the intralogistics goods transport devices including industrial trucks;

create a planning model of the goods logistics facility using the data stored in the logistics facility project file;

control a display to display a graphical representation of the planning model of the goods logistics facility, based on the data stored in the logistics facility project file;

simulate an operation of the goods logistics facility in the planning model and automatically optimizing the planning model based on a result of the simulation by performing one more times:

validate, based on the data describing the geometric and/or functional properties of the transport paths and the geometric and/or functional properties of the logistics infrastructure elements, whether a complete, continuously navigable lane graph can be created which:

connects one or more of the logistics infrastructure elements of a first type; and intersects one or more of the logistics infrastructure elements of a second type; and validate, based on the data describing the geometric and/or functional properties of the transport paths and the geometric and/or functional properties of the intralogistics goods transport devices, whether a prescribed distance to a non-driving area is maintained for the industrial trucks; and automatically optimize the planning model to attempt to create the complete, continuously navigable lane graph and to maintain the prescribed distance to the non-driving area for the industrial trucks;

update the data present in the logistics facility project file based on a result of the automatically optimizing the planning model;

generate traffic control rules for one or more of the industrial trucks to navigate an actual complete, continuously navigable path in the goods logistics facility constructed according to the updated data present in the logistics facility project file and to maintain the prescribed distance to the non-driving area in the goods logistics facility; and control the one or more of the industrial trucks by wired or wireless data connections based on the traffic control rules to move along the actual complete, continuously navigable path and to maintain the prescribed distance to the non-driving area.

12. The system according to claim 11, wherein the one or more processors are configured to:

control a running operation of the goods logistics facility, the running operation including an operation of the logistics infrastructure elements and/or the intralogistics goods transport devices; and carry out a control of the goods logistics facility using the data present in the logistics facility project file.

13. The system according to claim 12, wherein the one or more processors are configured to control the display to display a visualization of the goods logistics facility during operation using the data present in the logistics facility project file or data derived therefrom, wherein the logistics facility project file comprises:

dimensions of the building as design properties of the building;

dimensions and/or positions of logistics infrastructure elements as geometric properties of the logistics infrastructure elements; and dimensions of intralogistics goods transport devices as geometric properties of the intralogistics goods transport devices, wherein the visualization comprises:

a graphical representation of the building of the goods logistics facility, wherein a geometry of the graphical representation of the building takes into account the dimensions of the building, in at least approximately true-to-scale representation;

a graphical representation of the logistics infrastructure elements, wherein a geometry of the graphical representation of the logistics infrastructure elements takes into account the dimensions of the logistics infrastructure elements, in at least approximately true-to-scale representation, and/or the positions of the logistics infrastructure elements; and a graphical representation of the intralogistics goods transport devices, wherein a geometry of the graphical representation of the intralogistics goods transport devices takes into account the dimensions of the intralogistics goods transport devices, in at least approximately true-to-scale representation, wherein the logistics facility project file comprises functional properties of the logistics infrastructure elements and/or intralogistics goods transport devices present in the goods logistics facility, and wherein the one or more processors are configured to control the display to display:

a representation of a current functional state of the logistics infrastructure elements and/or of the intralogistics goods transport devices; and a representation of a current position and/or of congestion of the intralogistics goods transport devices.

14. The system according to claim 11, wherein the one or more processors are configured to:

control the display to display a current position of the intralogistics goods transport devices and/or an operating state of the logistics infrastructure elements in order to enable a diagnosis of malfunctions of the goods logistics facility, and/or to perform remote maintenance.

15. The system according to claim 11, wherein the one or more processors are configured to extend and/or modify the planning model of the goods logistics facility while adapting the data present in the logistics facility project file, and wherein the extension and/or the modification of the planning model comprises:

adapt geometric data;

describe dimensions of the building of the goods logistics facility;

adapt the geometric and/or functional properties of the logistics infrastructure elements;

exchange and/or supplement intralogistics goods transport devices or change a type of the intralogistics goods transport devices;

exchange and/or supplement the logistics infrastructure elements;

change geometric data describing permitted transport paths in the goods logistics facility;

change geometric data and/or functional data of the logistics infrastructure elements; and change geometric data and/or functional data of the intralogistics goods transport devices used in the goods logistics facility.

* * * * *